(12) United States Patent
Peng et al.

(10) Patent No.: US 8,114,758 B1
(45) Date of Patent: Feb. 14, 2012

(54) METHOD FOR AVOIDING DIE CRACKING

(75) Inventors: Hsui-Ping Peng, San Jose, CA (US); Jae-Hong Lee, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/848,839

(22) Filed: Aug. 2, 2010

Related U.S. Application Data

(63) Continuation of application No. 12/273,432, filed on Nov. 18, 2008, now Pat. No. 7,767,552.

(60) Provisional application No. 60/991,057, filed on Nov. 29, 2007.

(51) Int. Cl.
*H01L 21/301* (2006.01)

(52) U.S. Cl. .......................................... 438/460

(58) Field of Classification Search .................. 438/460
See application file for complete search history.

(56) References Cited

U.S. PATENT DOCUMENTS

| | | |
|---|---|---|
| 5,024,970 A | 6/1991 | Mori |
| 5,665,655 A | 9/1997 | White |
| 6,841,414 B1 | 1/2005 | Hu et al. |
| 2008/0191318 A1 | 8/2008 | Su et al. |
| 2009/0121321 A1 | 5/2009 | Miccoli et al. |

*Primary Examiner* — Alexander Ghyka
*Assistant Examiner* — Stanetta Isaac

(57) ABSTRACT

Methods directed to avoiding die cracking resulting from die separation are described herein. A method may include providing a substrate including a first die, a second die, and a monitor structure in an area between the first die and the second die, the monitor structure including a first dielectric material, removing the first dielectric material from the monitor structure, and after removing the first dielectric material, cutting the substrate along the area between the first die and the second die to separate the first die from the second die.

17 Claims, 4 Drawing Sheets

METHOD FOR AVOIDING DIE CRACKING

CROSS-REFERENCE TO RELATED APPLICATIONS

The present application is a continuation of non-provisional application Ser. No. 12/273,432 filed Nov. 18, 2008 entitled, "METHOD FOR AVOIDING DIE CRACKING," now U.S. Pat. No. 7,767,552, issued Aug. 3, 2010 which claims priority to U.S. Provisional Patent Application No. 60/991,057, filed Nov. 29, 2007, the entire disclosure of which is hereby incorporated by reference in its entirety for all purposes except for those sections, if any, that are inconsistent with this specification.

TECHNICAL FIELD

Embodiments of the present invention relate to the field of microelectronics, in particular, to methods for avoiding die cracking resulting from die separation.

BACKGROUND

Integrated circuits are typically formed on a wafer, which is then cut to singulate the individual dies. Singulating the dies may sometimes result in cracks that propagate from the dicing saw throughout the wafer and into the integrated circuit. For semiconductor devices including low-k (low-dielectric constant) interlayer dielectrics, the cracking problem may be even more problematic due at least in part to the poor adhesion and fragility of low-K dielectrics.

Some have attempted to mitigate cracking by laser-grooving the saw streets prior to sawing. Laser-grooving is accompanied by its own problems including the time-consuming aspect of laser-grooving the streets one at a time. As dies become even smaller, the time required to laser-groove all streets increases. Furthermore, laser-grooving is known to result in contamination of the dies from the settling of material vaporized by the laser. This contamination may result in degradation of the reliability of the dies.

SUMMARY

In view of the problems in the state of the art, embodiments of the invention are directed to methods for avoiding die cracking resulting from die separation. More specifically, with the foregoing and other items in view, there is provided, in accordance with various embodiments of the invention, a method comprising providing a substrate including a first die, a second die, and a monitor structure in an area between the first die and the second die, the monitor structure including a first dielectric material. The method further comprises removing the first dielectric material from the monitor structure, and after removing the first dielectric material, cutting the substrate along the area between the first die and the second die to separate the first die from the second die.

In some embodiments, the substrate may include a second dielectric material between the monitor structure and the first die, and between the monitor structure and the second die. The first dielectric material and the second dielectric material may comprise the same material. In various embodiments, the method may further comprise removing the second dielectric material. The second dielectric material may be removed by anisotropic etching.

In some embodiments, the monitor structure may be a process control monitor structure.

In some embodiments, the providing of the substrate may comprise forming the first die, the second die, and the monitor structure on the substrate.

In some embodiments, the first dielectric material may be a low-k dielectric oxide.

In some embodiments, the method may further comprise forming a photoresist layer over the first die, the second die, and the monitor structure, and patterning the photoresist layer to reveal the monitor structure. In some embodiments, the removing of the first dielectric material may comprise removing the first dielectric material from the revealed monitor structure. In some embodiments, the method may comprise removing the photoresist layer after removing the first dielectric material from the revealed monitor structure.

In some embodiments, the first dielectric material may be removed by isotropic etching.

In some embodiments, the method may comprise removing the monitor structure. In some embodiments, the cutting of the substrate may be performed after removing the monitor structure.

In some embodiments, the dielectric material may be disposed in a plurality of saw streets.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For purposes of this description, the phrase "A/B" means A or B. The phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to avoiding die cracking resulting from die separation. In various embodiments, die cracking may be avoided by removing material between dies before cutting the dies apart. By removing the material between the dies first, the edges of the dies may experience a reduced level of stress, relative to various related methods allowing such material to remain. This reduced level of stress may result in elimination of cracking of the die during separation. In some embodiments, the material between the dies may be removed by an etch operation, which may be faster and less likely to contaminate the dies.

Figure 1:
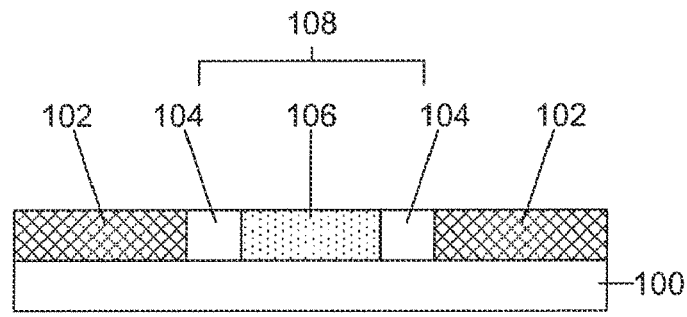
FIG. 1 illustrates a cross-sectional view of substrate including dies separated a dielectric material and a monitor structure in accordance with various embodiments of the present invention.

Turning now to FIG. 1, an apparatus comprising a substrate 100 including a plurality of dies 102 separated from each other by at least a material such as, for example, a dielectric material 104. The substrate 100 may comprise any substrate suitable for forming the plurality of dies 102 thereon. In some embodiments, for example, the substrate 100 may be silicon, silicon carbide, sapphire, gallium arsenide (or other III-IV material). In some embodiments, the dies 102 may be formed from one or more epitaxial layers formed on the substrate 100.

The dielectric material 104 may be any material generally disposed between dies for separating the active regions of the dies 102. In fact, in some embodiments, the material used to separate the dies may be a non-dielectric material. For embodiments in which a dielectric material is used, the dielectric material 104 may be one or more of an oxide, a nitride, and the like. In some embodiments, the oxide may be a low-k dielectric material. The dielectric material 104 may comprise one layer or may comprise a plurality of layers of the same or different material. For example, the dielectric material 104 may comprise a layer of oxide on a layer of nitride, or vice versa.

The substrate 100 may include at least one monitor structure 106. As illustrated, the monitor structure 106 may be disposed between at least two of the dies 102, further separating the dies 102 in addition to the dielectric material 104. In some embodiments, the dielectric material 104 may be disposed between the monitor structure 106 and the dies 102, as illustrated.

The monitor structure 106 may be any feature formed on the substrate 100 during processing for various purposes including, for example, aiding in characterizing or identifying defects in a process or design. The monitor structure 106 may be, for example, a process control monitor structure for yielding information predictive of the performance of a circuit with respect to its design specifications. Such data may be collected and analyzed to determine, for example, whether a die is "good" or "bad." In some embodiments, the monitor structure 106 may be identical to one or more of the dies 102, or may be some structure indicative of a process or design (e.g., structures to monitor defect density, dielectric coverage, sheet resistance, leakage, etc.).

The monitor structure 106 may be formed, at least in part, with a dielectric material. The dielectric material may be the same as the dielectric material 104, or it may be a different material. The dielectric material 104 may be one or more of an oxide, a nitride, and the like. In some embodiments, the oxide may be a low-k dielectric material.

Conventionally, the structure of FIG. 1 may undergo a cutting operation to singulate the dies 102. For such an operation, the structure may be cut generally along a saw street 108. As illustrated, the saw street 108 may generally include the monitor structure and at least some of the dielectric material 104. Cutting along the saw street 108 may, however, cause cracking in one or more of the dies 102 and/or the substrate 100. This cracking may result from the sheer force along the junction of the metal of the dies 102 and the dielectric material 104.

To avoid cracking, the dielectric material 104 and the monitor structure 106 may be removed prior to singulating the dies 102. FIGS. 2-12 illustrate an exemplary method for avoiding cracking of the apparatus illustrated in FIG. 1 by way of cross-sectional side views of the apparatus at various stages of the method. It should be noted that various operations discussed and/or illustrated may be generally referred to as multiple discrete operations in turn to help in understanding embodiments of the present invention. The order of description should not be construed to imply that these operations are order dependent, unless explicitly stated. Moreover, some embodiments may include more or fewer operations than may be described.

Figure 2:
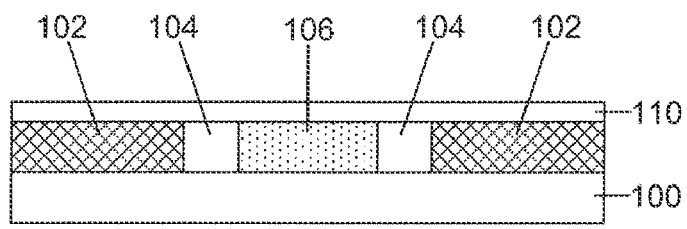
FIGS. 2-12 illustrate cross-sectional views of the substrate of FIG. 1 at various stages of a method in accordance with various embodiments of the present invention.

To selectively remove the dielectric material 104, while leaving other areas undamaged, a photolithographic operation may be used for exposing only those areas that include material to be removed. As illustrated in FIG. 2, such a method may include forming a photoresist layer 110 over at least the dies 102. As photoresist is typically applied by spin-coating, it may be the case that the photoresist layer 110 is applied over the entire surface including over the dielectric material 104 and the monitor structure 106.

Figure 3:
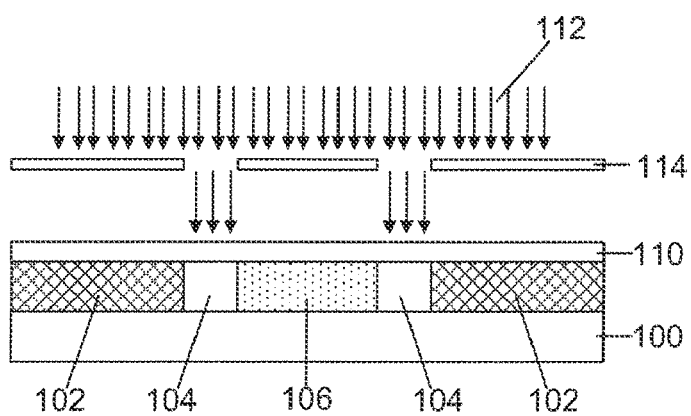
Figure 4:
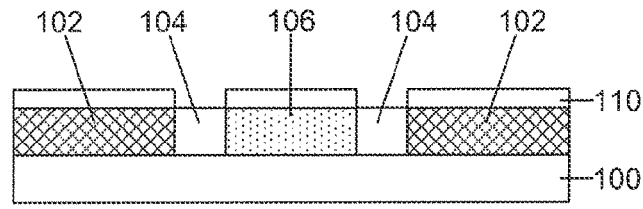

The photoresist layer 110 may then be patterned as illustrated in FIGS. 3 and 4. Patterning may include exposing the desired pattern of radiation 112 onto the surface of the photoresist layer 110 using a mask 114. In the illustrated embodiment, the exposed pattern corresponds to the locations of the dielectric material 104 to be removed. Although the illustrated embodiment depicts the photoresist layer 110 as being a positive photoresist, a negative photoresist may be similarly suitable.

Patterning the photoresist layer 110 may further include developing the pattern as illustrated in FIG. 4. The exposed regions of the photoresist layer 110 (or un-exposed regions if a negative photoresist is used) are removed to reveal the dielectric material 104 thereunder. The exposed regions of the photoresist layer 110 may be removed by any method suitable for the purpose including, for example, a rinse operation.

Figure 5:
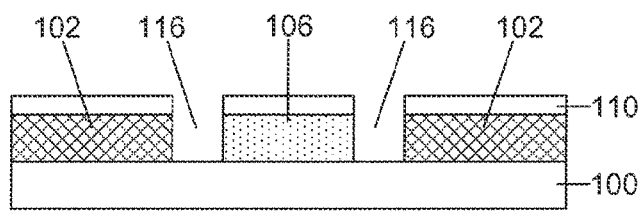

The revealed dielectric material 104 may be removed as illustrated in FIG. 5. The revealed dielectric material 104 may be removed using any etch operation suitable for the purpose. In some embodiments, for example, the revealed dielectric material may be removed using an anisotropic etch (e.g., a dry etch). It may be possible, however, to use an isotropic etch.

Next, the dielectric material 104 may be removed, leaving gaps 116, as illustrated in FIG. 5. In the illustrated embodiment, gaps 116 are formed between the monitor structure 106 and the dies 102. In embodiments not including the monitor structure 106, the gaps may be between adjacent dies 102. Although the illustrated embodiment depicts the dielectric material 104 being completely removed, a beneficial reduction in cracking may be achieved by removing even less than all of the dielectric material 104. In many embodiments, however, the dielectric material 104 will be removed substantially down to the substrate 102, although some dielectric material 104 may remain in locations as desired (e.g., on the sidewalls of the dies 102).

Figure 6:
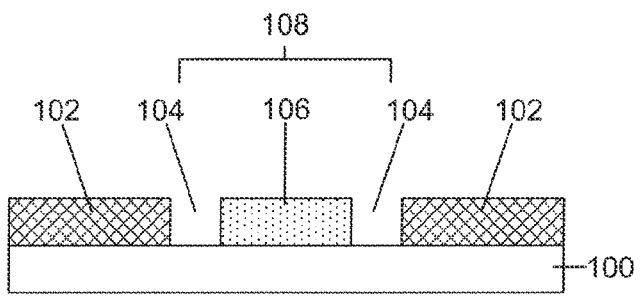

Next, the photoresist layer 110 may be removed as illustrated in FIG. 6 using any suitable photoresist strip operation.

Figure 7:
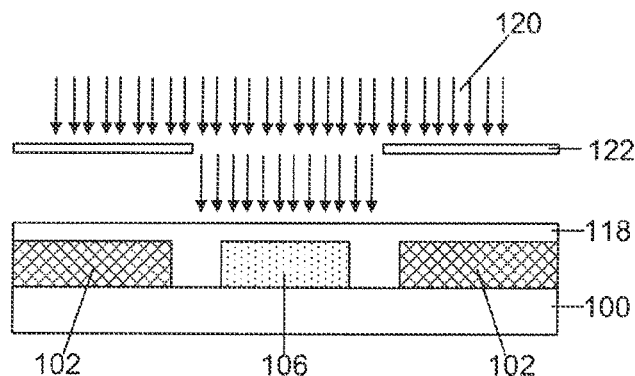

As illustrated in FIG. 7, another photoresist layer 118 may be formed over at least the dies 102. As photoresist is typically applied by spin-coating, it may be the case that the photoresist layer 110 is applied over the entire surface including over the dielectric material 104 and the monitor structure 106.

The photoresist layer 118 may then be patterned by exposing the desired pattern of radiation 120 onto the surface of the photoresist layer 118 using a mask 122. In the illustrated embodiment, the exposed pattern corresponds generally to the location of the monitor structure 106. Although the illustrated embodiment depicts the photoresist layer 118 as being a positive photoresist, a negative photoresist may be similarly suitable.

Figure 8:
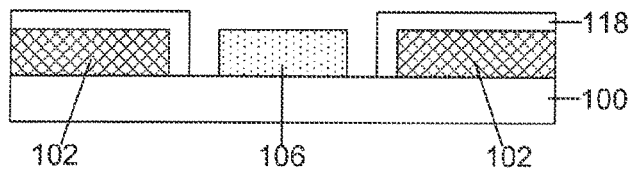

Patterning the photoresist layer 118 may further include developing the pattern as illustrated in FIG. 8. The exposed regions of the photoresist layer 118 (or un-exposed regions if a negative photoresist is used) are removed to reveal the monitor structure 106 thereunder. The exposed regions of the photoresist layer 118 may be removed by any method suitable for the purpose including, for example, a rinse operation.

Figure 9:
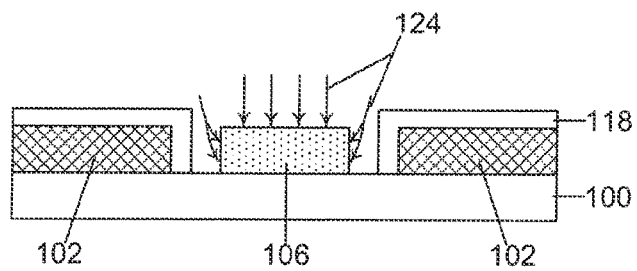

Dielectric material in the revealed monitor structure 106 may be removed. The dielectric material of the revealed monitor structure 106 may be removed using any etch operation suitable for purpose. In some embodiments, for example, the dielectric material may be removed using an isotropic etch (e.g., a wet etch) as illustrated in FIG. 9. The isotropic etch etches in a multi-directional manner and thus the etching action 124 may be capable of attacking all exposed surfaces of the monitor structure 106.

Figure 10:
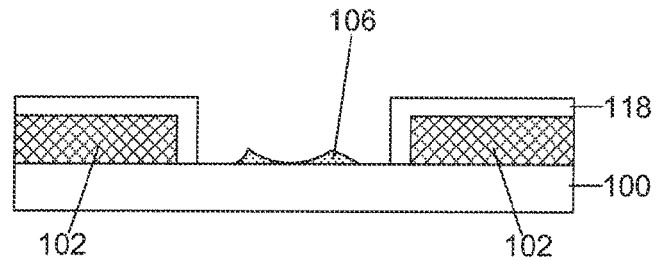

As the monitor structure 106 may comprise material in addition to dielectric material (e.g., metal), a collapsed structure of material 126 may remain after removing the dielectric material from the monitor structure 106 as illustrated in FIG. 10. In some embodiments, however, the remaining material 126 may be washed away by the etch operation (see FIG. 9). This may especially be the case if the dielectric material adhering the monitor structure 106 to the substrate 100 is etched away.

Figure 11:
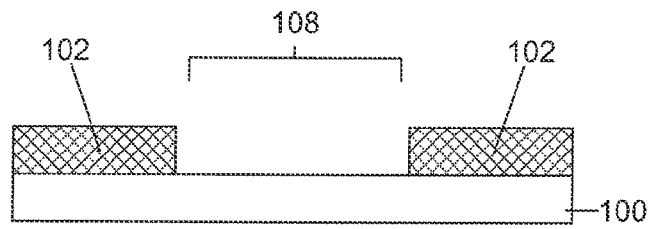

If material 126 remains after the etch operation, a rinse operation may be used for clearing away such material, if desired, as illustrated in FIG. 11. In some embodiments, the remaining material 126 need not be removed. The photoresist layer 118 may also be removed as illustrated in FIG. 11 using any suitable photoresist strip operation. In some embodiments, the photoresist strip operation may be sufficient to remove the remaining material 126.

Figure 12:

The dies 102 may then be singulated by cutting the substrate 100 along the saw street 108, resulting in the singulated dies 102 as illustrated in FIG. 12. Singulating the dies 102 may be accomplished using any method suitable for the purpose including, for example, sawing.

As discussed herein, owing at least in part to the removal of the dielectric material 104 and the monitor structure 106, the dies 102 may have less cracking relative to methods allowing the dielectric material 104 and/or monitor structure 106 to remain in place. Moreover, the dielectric material 104 between the dies 102 may be removed faster and with less contamination relative to laser-grooving methods.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   providing a substrate including a first die, a second die, and a monitor structure, the substrate further including a first dielectric material (i) between the monitor structure and the first die and (ii) between the monitor structure and the second die, and the monitor structure including a second dielectric material, wherein the monitor structure is formed on a first part of the substrate;
   etching the first dielectric material;
   subsequent to the etching the first dielectric material, etching the second dielectric material from the monitor structure;
   subsequent to the etching the second dielectric material, etching the monitor structure; and
   cutting the substrate between the first die and the second die to separate the first die from the second die, wherein the cutting the substrate further comprises cutting at least a portion of the first part of the substrate.

2. The method of claim 1, wherein the monitor structure is a process control monitor structure.

3. The method of claim 1, wherein the providing a substrate comprises
   forming the first die, the second die, the monitor structure, and the first dielectric material.

4. The method of claim 1, wherein the each of the first dielectric material and the second dielectric material comprises a low-k dielectric oxide.

5. The method of claim 1, wherein the etching the second dielectric material from the monitor structure comprises wet etching the monitor structure.

6. The method of claim 1, further comprising
   removing the monitor structure having the second dielectric material etched therefrom,
   wherein the cutting the substrate is performed after removing the monitor structure.

7. The method of claim 1, wherein the monitor structure and the first dielectric material are disposed in a plurality of saw streets.

8. The method of claim 1, wherein
   the first dielectric material between (i) the monitor structure and the first die, and between (ii) the monitor structure and the second die, is anisotropically etched, and
   wherein the second dielectric material is isotropically etched from the monitor structure.

9. A method comprising:
   providing a substrate including a first die, a second die, and a monitor structure, the substrate further including a first dielectric material (i) between the monitor structure and the first die and (ii) between the monitor structure and the second die, and the monitor structure including a second dielectric material;

etching the first dielectric material;

subsequent to the etching the first dielectric material, forming a photoresist layer over (i) the first die, (ii) the second die, and (iii) the monitor structure;

patterning the photoresist layer to reveal the monitor structure;

etching the second dielectric material from the monitor structure; and cutting the substrate between the first die and the second die to separate the first die from the second die.

10. The method of claim 9, further comprising removing the photoresist layer after etching the revealed monitor structure.

11. The method of claim 9, wherein the monitor structure is a process control monitor structure.

12. The method of claim 9, wherein the providing a substrate comprises forming the first die, the second die, the monitor structure, and the first dielectric material.

13. The method of claim 9, wherein each of the first dielectric material and the second dielectric material comprises a low-k dielectric oxide.

14. The method of claim 9, wherein the etching the second dielectric material from the monitor structure comprises wet etching the monitor structure.

15. The method of claim 9, further comprising removing the monitor structure having the second dielectric material etched therefrom, wherein the cutting the substrate is performed after removing the monitor structure.

16. The method of claim 9, wherein the monitor structure and the first dielectric material are disposed in a plurality of saw streets.

17. The method of claim 9, wherein the first dielectric material between (i) the monitor structure and the first die, and between (ii) the monitor structure and the second die, is anisotropically etched, and wherein the second dielectric material is isotropically etched from the monitor structure.

* * * * *